United States Patent
Wan et al.

(10) Patent No.: US 7,915,942 B2
(45) Date of Patent: Mar. 29, 2011

(54) APPARATUS AND METHOD FOR CALIBRATING A VARIABLE PHASE SHIFTER

(75) Inventors: Kwun Chiu Wan, Kowloon (HK); Quan Xue, Kowloon (HK)

(73) Assignee: City University of Hong Kong, Kowloon Tong (HK)

( * ) Notice: Subject to any disclaimer, the term of this patent is extended or adjusted under 35 U.S.C. 154(b) by 28 days.

(21) Appl. No.: 12/544,667

(22) Filed: Aug. 20, 2009

(65) Prior Publication Data
US 2011/0043266 A1    Feb. 24, 2011

(51) Int. Cl.
*H03K 3/00* (2006.01)
(52) U.S. Cl. .................... 327/234; 327/233; 327/236
(58) Field of Classification Search .............. None
See application file for complete search history.

(56) References Cited

U.S. PATENT DOCUMENTS

| | | | |
|---|---|---|---|
| 5,861,843 A | 1/1999 | Sorace et al. | |
| 6,339,399 B1 | 1/2002 | Andersson et al. | |
| 6,486,716 B1 * | 11/2002 | Minami et al. | 327/152 |
| 7,327,173 B2 * | 2/2008 | Kim | 327/149 |
| 7,772,898 B2 * | 8/2010 | Cheung | 327/158 |
| 2004/0056799 A1 | 3/2004 | Sinsky et al. | |

OTHER PUBLICATIONS

Cottony, H., "Wide-frequency-band radar array antenna system with suppressed grating lobes," IEEE Trans. Antennas and Propagation, vol. 18, No. 6, pp. 774-779, Nov. 1970.

Mayer, B., "Planar broadband image rejection mixer," IEEE Electronic Letters, vol. 27, No. 23, pp. 2128-2130, Nov. 1991.

Sung, Y.J. and Kim, Y.S., "Circular polarized microstrip patch antennas for broadband and dual-band operation," IEEE Electronics Letters, vol. 40, No. 9, pp. 520-522, Apr. 2004.

Wan, K.C. and Xue, Q., "Indirect Controlled Phased Source," IEEE Microw. and Wireless Components Letters, vol. 16, No. 12, pp. 702-704, Dec. 2006.

Wan, K.C. and Xue, Q., "A Novel Reconfigurable Wideband Circularly Polarized Transmitter Implemented by Indirect-Controlled-Phased Source," IEEE Antennas and Wireless Propagation Letters, vol. 6, pp. 604-607, 2007.

\* cited by examiner

*Primary Examiner* — An T Luu
(74) *Attorney, Agent, or Firm* — Stites & Harbison PLLC; Douglas E. Jackson

(57) ABSTRACT

A reference signal is split and input to first and second variable phase shifters 10, 20. The first and second variable phase shifters output to first and second inputs 31, 32 respectively of a phase comparator 30. Initially, the first and second variable phase shifters 10, 20 are preferably set to the same phase. The first and second phase shifters are then aligned, e.g. by adjusting the calibration of one or both of the phase shifters so that the phase comparator 30 indicates that they output the same phase. The phase of the first phase shifter 10 is then adjusted by one step and a phase delay section 60 is placed between the output of the second phase shifter 20 and the second input 32 of the phase comparator 30. The first and second phase shifters 10, 20 are then aligned again.

14 Claims, 3 Drawing Sheets

(a)

(b)

(c)

APPARATUS AND METHOD FOR CALIBRATING A VARIABLE PHASE SHIFTER

The present invention relates to an apparatus and method for aligning variable phase shifters. In particular the method and apparatus makes it possible to calibrate the phase steps of a variable phase shifter.

BACKGROUND

Phase shifters are widely used in a variety of wireless communications. For example, phase shifters are used in antenna arrays, circularly polarized antennas, image rejecting mixers, QPSK receivers, etc. There are lots of applications, especially for variable phase shifters, which have tunable insertion phase. The variable phase shifter provides flexibility when signals with different phases are required. By using a variable phase shifter, an antenna array can be configured to be a phased array, which provides beam steering ability. When a variable phase shifter is used to provide the phase of quadrature signals for driving a circularly polarized antenna, the phase can be offset at different frequencies to widen the axial ratio bandwidth. This phase offset technique can be applied to the image rejecting mixer and QPSK receiver too.

However, a difficulty exists because phase shifters may deviate from their specified or expected performance. Sometimes, the phase shift injected by a phase shifter, especially a variable phase shifter, may change according to the surrounding environment or vary over time. This error in the signal phase may introduce a beam steering error into a phased array, resulting in a reduction in maximum gain. An error in signal phase may greatly degrade the image rejection ability of an image rejecting mixer. Indeed, phase error may reduce the performance of many different applications.

SUMMARY OF THE INVENTION

The present invention provides an apparatus and a method for calibrating a variable phase shifter.

A first aspect of the present invention provides a method of calibrating a variable phase shifter comprising:—
a) providing first and second variable phase shifters; the first variable phase shifter having an output coupled to a first input of a phase comparator, the second variable phase shifter having an output coupled to a second input of said phase comparator
b) setting the first variable phase shifter at a first phase and the second variable phase comparator to a second phase;
c) aligning the first and second variable phase shifters
d) delaying the phase of a signal passing between the output of the second variable phase shifter and the second input of the phase comparator;
e) adjusting the phase of the first or second variable phase shifter to a third phase; and
f) aligning the first and second variable phase shifters.

Preferably the first phase and the second phase are the same, i.e. they have the same phase shift, which may be a zero phase shift. In that way the first and second variable phase shifters are aligned with each other when at zero phase shift in step (c) and then aligned again at step (f) when they have different phrases. In step (e) the first phase shifter is preferably adjusted to shift the phase by one step compared to the second phase shifter.

Preferably the steps (a) to (f) are carried out in the above order. However, that is not absolutely essential. For example, step (e) could be carried out before step (d). Steps (d) to (f) could be carried out before steps (b) and (c). What is important is that the variable phase shifters are aligned at least twice. In one of the alignments, the first variable phase shifter is set to shift the phase by one or more steps compared to the second variable phase shifter, and a delay is placed between the second variable phase shifter and the phase comparator.

In the alignment steps (c) and (f), the variable phase shifters are aligned so that the output of the phase comparator is zero, or below a predetermined threshold or within a predetermined range. That is the output of the phase comparator indicates that the phase difference is zero, below a certain threshold, or within a certain range. When the first and second phases are the same, the phase difference should be zero, or below a predetermined threshold. The aligning may be achieved, for example, by adjusting the calibration of one or both variable phase shifters. The aligning in steps (c) and (f) and/or the delaying in step (d) may be carried out automatically by a controller, e.g. a computer, MCU, processor or other similar device.

Step c) may involve adding a delay section to a line coupling the output of the second phase shifter to the second input of the phase comparator, or switching from a line without a delay section to a line with a delay section. The delay section is a section having a known phase delay. Preferably the phase delay is equal to one phase step of the variable phase shifter, or a multiple thereof (where the phase shifters operate in steps). The delay section may, for example, comprise a delay line, a capacitor, a ground switched capacitor or a switching stub. Preferably in step e) the output phase of the first variable phase shifter is adjusted by a step or amount equal to the known phase delay of the delay section. Where the variable phase shifters are adjustable in discrete steps of phase, the known phase delay is preferably approximately equal to one phase step, or a multiple thereof.

The method may comprise a further step, after step f), of adjusting the second variable phase shifter to a fourth phase, removing (e.g. using a switch to by-pass) the phase delay section, and then aligning the phase of the first and second phase shifters. In this way the next step of the second phase shifter is aligned. This may be carried out for all possible phases/phase steps, e.g. next the first variable phase shifter is advanced by another step, the phase delay is added between the second phase shifter and the phase comparator again, and the first and second phase shifters are aligned again.

In one embodiment the apparatus is an auto calibration scheme which comprises a phase comparator, a fixed delay line and one or more switches controlled by a controller, e.g. an MCU or computer.

A second aspect of the present invention provides an apparatus for calibrating a pair of variable phase shifters comprising a first variable phase shifter, a second variable phase shifter and a phase comparator, the first variable phase shifter having an output coupled to a first input of the phase comparator, the second variable phase shifter having an output coupled to a second input of the phase comparator; a first path between the output of the second phase shifter and the second input of the phase comparator and a second path between the output of the second variable phase shifter and the second input of the phase comparator, said second path having a known phase delay compared to the first path; and a switch for switching the output of the first phase shifter between said first and second paths.

The apparatus may have a controller arranged for controlling the switch and for calibrating one or both variable phase shifters on the basis of the output of the phase comparator. In that way the first and second variable phase shifters may be aligned for one or more of their phase shifting steps. The controller may be configured for automatically controlling the variable phase shifters and the switch using the method of the first aspect of the present invention.

The second path may have a phase delay section. The phase delay section preferably comprises a capacitor or a switching stub. Any features of the first and second aspects of the present invention may be combined with each other.

BRIEF DESCRIPTION OF THE DRAWINGS

FIG. 2 (b) is a schematic diagram showing a second step in the calibration method;

FIG. 2 (c) is schematic diagram showing a third step in the calibration method.

DETAILED DESCRIPTION OF THE PREFERRED EMBODIMENTS

Variable phase shifters are configured to controllably shift the phase of their output signal by a variable amount, relative to the phase of a reference signal or an input signal. The phase shift may be varied and can be adjusted by controlling the phase shifter. This control of the phase shifter may be electrical, magnetic or mechanical (e.g. by turning a dial). The phase shifter may be analog (in which case the phase shift may be varied continuously) or digital (in which case the phase shift is usually adjusted in discrete steps). In the case of electrical control, the control signal may, for example, be a control voltage or an electronic signal indicating the desired phase shift.

It would be desirable to calibrate the variable phase shifter so that the control (mechanical, magnetic or electrical) adjusts the phase shift by the desired amount. For example, it can be checked that when a control signal instructs the phase shifter to shift the phase by X degrees that the phase is actually shifted by X degrees. If not, then the calibration of the phase shifter is adjusted so that it provides the desired phase shift.

Figure 1:
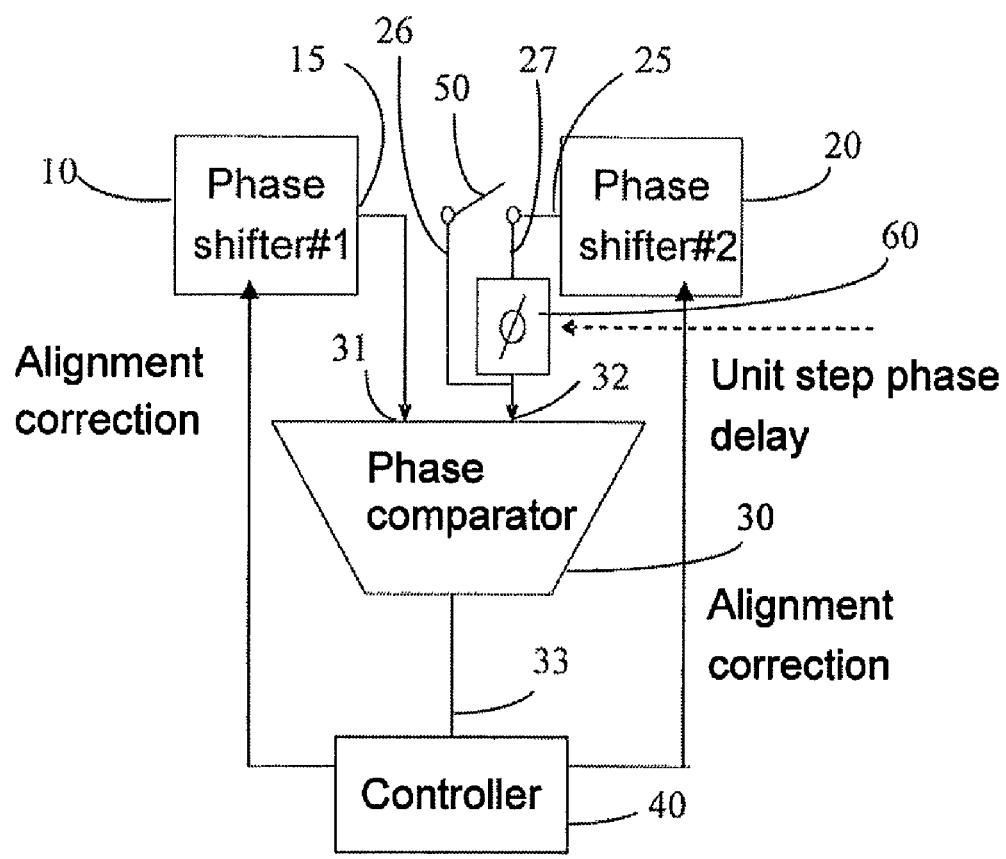
FIG. 1 is a schematic diagram showing an apparatus for calibrating a variable phase shifter.

An apparatus for calibrating a variable phase shifter is shown in FIG. 1. The apparatus comprises a first variable phase shifter 10 and a second variable phase shifter 20. The second variable phase shifter may have already been calibrated previously, e.g. by the same method or by reference to an oscilloscope or other phase measuring apparatus. In this case the first variable phase shifter is aligned and calibrated to the second phase shifter. Alternatively the first variable phase shifter may have already been calibrated and the second variable phase shifter is calibrated to the first variable phase shifter. Alternatively, the apparatus may be used to align both the variable phase shifters, so that they are calibrated to each other, regardless of whether one or both have been calibrated previously.

The output 15 of the first variable phase shifter is coupled to a first input 31 of a phase comparator 30. The output 25 of the second variable phase shifter 20 is coupled to a second input 32 of the phase comparator 30. The phase comparator 30 compares the phase of the signals received at its first input 31 and its second input 32. The phase comparator has an output 33 for outputting a signal, based on the phase comparison, to a controller 40. The controller 40 may be a MCU, computer, processor or any other type of control unit.

The controller controls one, or both, of the first and second phase shifters 10, 20 on the basis of the signal received from the phase comparator 30. In particular it aligns the first and second variable phase shifters with each other by adjusting the calibration of one, or both, of the variable phase shifters, such that the signals received at the first and second 31, 32 inputs of the phase comparator have the same phase, give or minus a predetermined tolerance. E.g., when a voltage output by the phase comparator is non-zero, or above a certain threshold, then the calibration of one, or both of, the variable phase shifters is adjusted. If the first variable phase shifter is being calibrated then the calibration of the first variable phase shifter is adjusted. If the second variable phase shifter is being calibrated then the calibration of the second variable phase shifter is adjusted. If the purpose is simply to align the variable phase shifters with each other, then the calibration of either one, or both, of the variable phase shifters is adjusted.

The output of the first variable phase shifter 10 is coupled to the first input 31 of the phase comparator 30. The output of the second variable phase shifter 20 is coupled to the second input 32 of the phase comparator. There are two possible paths between the output 25 of the second variable phase shifter and the second input 32 of the phase comparator 30. The first path 26 has a similar phase delay to the path linking the output 15 of the first variable phase shifter 10 to the first input 31 of the phase comparator 30. Preferably this phase delay is negligible.

The second path 27 linking the second variable phase shifter 20 and the second input 32 has a phase delay section 60. For example, the phase delay section 60 may comprise one or more capacitors, a switching stub or any other appropriate means for delaying phase. The phase delay section 60 delays the phase of a signal passing through it by a known amount. This makes it useful for calibration purposes. Where the variable phase shifters are of a type which shift the phase in discrete steps (e.g. digital phase shifters) then the phase delay section preferably has a phase delay equal to the phase shift step of the variable phase shifter or a multiple thereof. The apparatus has a switch 50 on the first path 26. When the switch 50 is closed the output signal from the second variable phase shifter passes down the first path 26. When the switch is open the output signal passes down the second path 27 and through the phase delay section 60.

The method by which the apparatus calibrates or aligns the variable phase shifters 10, 20 is shown in FIGS. 2(a), 2(b) and 2(c).

FIG. 2(a) shows a first step. A reference signal is split and provided to both the first variable phase shifter and the second variable phase shifter. The first variable phase shifter is set to a 'first phase', i.e. to introduce a phase shift of a first amount. The second variable phase shifter is set to a second phase, i.e. to introduce a phase shift of a second amount. In this example, both the 'first phase' and the 'second phase' are the same: a zero phase shift compared to a reference signal that is fed into both variable phase shifters.

In the step shown in FIG. 2(a) the switch 50 is closed and the output of the second phase shifter 20 passes down the first path 26 to the second input 32 of the phase comparator. The output of the phase comparator 30 is coupled to the controller 40. The controller 40 controls one, or both, of the variable phase shifters 10, 20 to align their output phases, until there is no output from the phase comparator, (i.e. no phase difference), or until the output is below a predetermined threshold. This control is carried out automatically by the controller 40 which adjusts the calibration of the variable phase shifters. For example, the variable phase shifter may have a table which stores the appropriate response to a control signal and this table may be updated with new values, which give the appropriate phase shift in response to a given control signal. After this initial setting in FIG. 2(a), the two phase shifters are aligned correctly.

At a next step, shown in FIG. 2(b) the phase of the two phase shifters 10, is made different. For example, the first phase shifter is controlled by an electrical signal or otherwise, to delay the phase by a third amount (preferably equal to one phase step of the phase shifter). Thus the first variable phase shifter is switched to a third phase which is delayed compared to the first phase. The switch 50 is then opened so that the output signal of the second phase shifter 20 passes down the second path to the second input 32 of the phase comparator. Preferably the difference between the first and third phases (the size of the phase step) is equal to the delay of the delay section 60. Thus, in theory, the signals received by the first and second inputs of the phase comparator 30 should have the same phase. If they do not have the same phase, then the variable shifters are not aligned and this is indicated by the output from the phase comparator 30. The controller 40 then aligns the first and second variable phase shifters again by controlling the calibration of one or both variable phase shifters until there is no output from the phase comparator, or the output is below a predetermined threshold. As a result of this step the first phase step of the first variable phase shifter 10 is calibrated accurately with respect to the second variable phase shifter.

Figure 2:
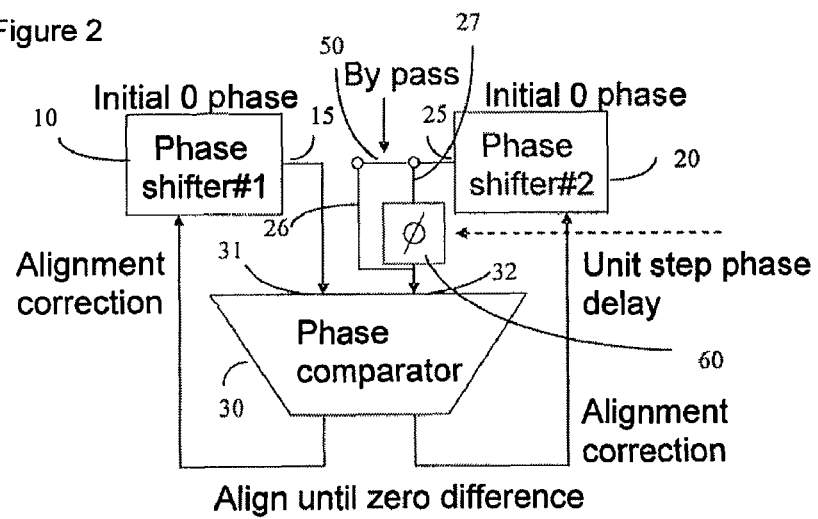
FIG. 2 (a) is a schematic diagram showing a first step in the calibration method.
Figure 2:
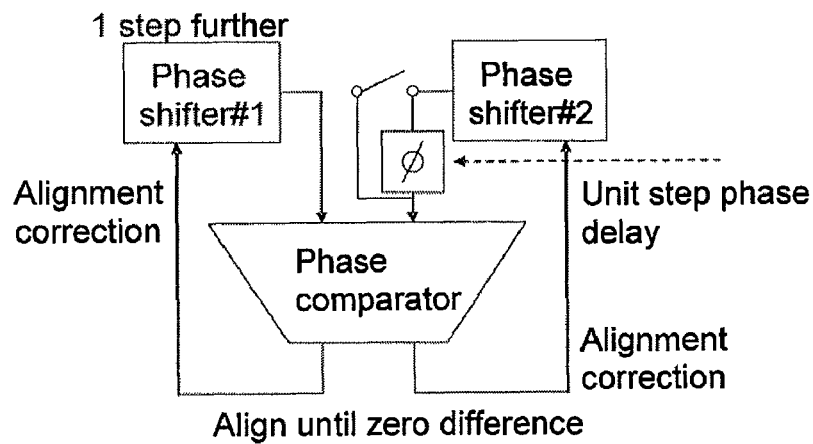
Figure 2:
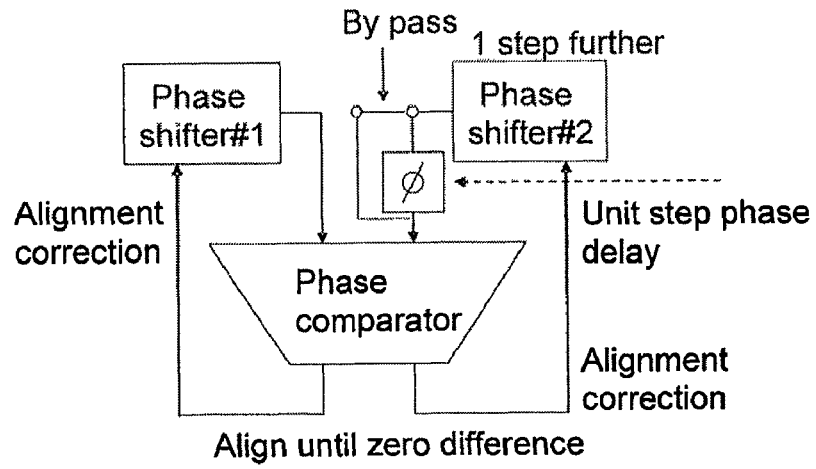

In the next step, shown in FIG. 2 (c), both the first variable phase shifter 10 and the second variable phase shifter 20 are set at 1 step delay. (E.g. the first variable phase shifter is set at a third phase and the second variable phase shifter is set at a fourth phase. The second and fourth phases are the same and delay the phase by one step of the variable phase shifter). The switch 50 is closed so that the phase delay section 60 is by-passed and the signal travels from the output of the second phase shifter to the second input of the phase comparator. The controller 40 then aligns the two variable phase shifters again on the basis of the output of the phase comparator. After this step, if the third phase (i.e. first phase step) of first phase shifter is calibrated correctly, then the second phase shifter is aligned correctly in its fourth phase too.

All the phase shift steps of the variable phase shifters can be aligned and calibrated correctly by repeating the three procedure steps as described above. This calibration scheme can be applied to all types of variable phase shifters.

While it is preferred to start the first and second phase shifters in the same phase (i.e. preferably the first and second phases are the same), it would in theory be possible to have the two phases different. In that case the alignment could be with respect to an expected output signal or voltage from the phase comparator. E.g. if the first and second phases are 5 degrees apart and it was expected that a 5 degree phase difference would give a 2 V signal, then the alignment can be until a 2V output signal from the phase comparator is achieved plus or minus a given tolerance. In this case the third and fourth phases differ by the same amount also, etc.

Figure 3:
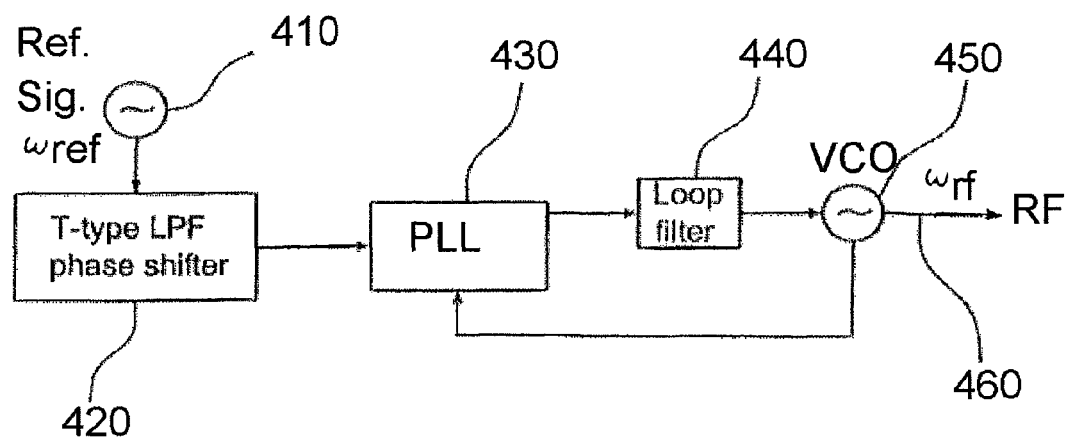
FIG. 3 is a circuit diagram of an Indirect Controlled Phased Source

There are many types of variable phase shifter. In one preferred embodiment the phase shifters are indirect controlled phased sources (ICPS), as disclosed in the applicant's previous application U.S. Ser. No. 11/739,198 filed on 24 Apr. 2007. An example of such an ICPS is given in FIG. 3. It can be seen that the ICPS comprises a VCO (Voltage Controlled Oscillator) 450 and a phase locked loop 430. The output phase of the VCO 450 is controlled indirectly by controllably varying the phase of the reference signal 410 which is input to the phase locked loop via a phase shifter 420. This means that it is not necessary to have a separate signal source. However, in other embodiments the variable phase shifters need not include a VCO or radiation source. The variable phase shifter may simply be a device through which a signal is passed. For example, a VCO or other signal could be split and passed through the first and second variable phase shifters in parallel.

In one embodiment the first and/or second variable phase shifters are configured to shift the phase of a 900 MHz signal in discrete steps of 5° and the delay section is a ground switched capacitor that provides 5° phase delay. The capacitor employed is preferably a high grade capacitor that is stable over a wide range of temperature.

It will be appreciated, by those skilled in the art, that the above is just an example and that other configurations could be used. For example, the signal need not be 900 MHz, but could be any other suitable frequency. Furthermore the steps need not be 5°, but could be another value. Various alternative delay sections could be used instead of a ground switched capacitor. For example, a switching stub could be used. In fact, a switching stub may be more accurate as it can tuned to any continuous value of phase delay by varying its length and/or width. Furthermore, it will be appreciated that the above described steps of FIGS. 2(a)-2(c) need not necessarily be performed in order. For example, they could be performed backwards, or in a different sequence.

The invention claimed is:

1. A method of calibrating a variable phase shifter comprising:
   a) providing first and second variable phase shifters; the first variable phase shifter having an output coupled to a first input of a phase comparator, the second variable phase shifter having an output coupled to a second input of said phase comparator
   b) setting the first variable phase shifter at a first phase and the second variable phase shifter to a second phase;
   c) aligning the first and second variable phase shifters;
   d) delaying the phase of a signal passing between the output of the second variable phase shifter and the second input of the phase comparator;
   e) adjusting the phase of the first or second variable phase shifter to a third phase;
   f) aligning the first and second variable phase shifters.

2. The method of claim 1 wherein said first and second phases are the same.

3. The method of claim 1 wherein the aligning is carried out automatically by a controller in response to the output of the phase comparator.

4. The method of claim 1 wherein in step d) the phase of the signal is delayed by an amount equal to the phase difference between said first and third phases.

5. The method of claim 1 wherein first and second paths are provided between an output of the second phase shifter and the second input of the phase comparator, the second path having a delay section; and wherein step d) involves switching a signal, between the second phase shifter and the phase comparator, from said first path to said second path.

6. The method of claim 1 wherein the phase is delayed by use of a delay line, a capacitor or a switching stub.

7. The method of claim 1 comprising the further step, after step f), of adjusting the second phase shifter to, the second phase, removing the phase delay, and then aligning the phase of the first and second phase shifters.

8. The method of claim 1 wherein one, or both of, the first and second phase shifters are indirect phase controlled sources.

9. An apparatus for calibrating a variable phase shifter, comprising a first variable phase shifter, a second variable phase shifter and a phase comparator, the first variable phase shifter having an output coupled to a first input of the phase comparator, the second variable phase shifter having an output coupled to a second input of the phase comparator; a first path between the output of the second phase shifter and the second input of the phase comparator and a second path between the output of the second variable phase shifter and the second input of the phase comparator, said second path having a known phase delay compared to the first path; and a switch for switching the output of the second phase shifter between said first and second paths.

10. The apparatus of claim 9 having a controller arranged for controlling the switch and for calibrating one or both variable phase shifters on the basis of the output of the phase comparator.

11. The apparatus of claim 10 wherein the controller is configured for automatically controlling the adjustable phase shifters and the switch using the method of claim 1.

12. The apparatus of claim 11 wherein the second path has a phase delay section.

13. The apparatus of claim 12 wherein the phase delay section comprises a capacitor or a switching stub.

14. The apparatus of claim 9 wherein the known phase delay is equal to one phase shift step of the variable phase shifters, or a multiple thereof.

* * * * *